United States Patent [19]
Nakamura et al.

[11] Patent Number: 5,594,257
[45] Date of Patent: Jan. 14, 1997

[54] SUPERCONDUCTING DEVICE HAVING A SUPERCONDUCTING CHANNEL FORMED OF OXIDE SUPERCONDUCTOR MATERIAL AND METHOD FOR MANUFACTURING THE SAME

[75] Inventors: Takao Nakamura; Michitomo Iiyama, both of Osaka, Japan

[73] Assignee: Sumitomo Electric Industries, Ltd., Osaka, Japan

[21] Appl. No.: 80,844

[22] Filed: Jun. 24, 1993

[30] Foreign Application Priority Data

| | | | |
|---|---|---|---|
| Jun. 24, 1992 | [JP] | Japan | 4-190100 |
| Jun. 24, 1992 | [JP] | Japan | 4-190101 |
| Jun. 25, 1992 | [JP] | Japan | 4-191671 |
| Jun. 26, 1992 | [JP] | Japan | 4-193014 |

[51] Int. Cl.⁶ .......................... H01L 39/22; B05D 5/12; H01B 12/00
[52] U.S. Cl. ................. 257/39; 257/36; 257/38; 505/193; 505/234; 505/237; 505/239; 505/480; 427/62; 427/63
[58] Field of Search .............. 257/36–39; 505/1, 505/700, 701, 702, 191–193, 234–239, 480; 427/62, 63

[56] References Cited

U.S. PATENT DOCUMENTS

| 5,071,832 | 12/1991 | Iwamatu | 505/1 |
|---|---|---|---|
| 5,179,426 | 1/1993 | Iwamatsu | 505/1 |
| 5,240,906 | 8/1993 | Bednorz et al. | 257/39 |

FOREIGN PATENT DOCUMENTS

| 0276746 | 8/1988 | European Pat. Off. . | |
|---|---|---|---|
| 0478466 | 4/1992 | European Pat. Off. . | |
| 151680 | 2/1989 | Japan . | |
| 4134881 | 5/1992 | Japan | 257/39 |
| 4168781 | 6/1992 | Japan | 257/39 |

OTHER PUBLICATIONS

Olsson et al, "Crack Formation in Epitaxial Thin Films of Y–BA–Cu–O & PR–Ba–Cu–O on $SrTiO_3$ Substrate", Appl. Phys. Lett. vol. 58, No. 15. 15 Apr. 1991, pp. 1682–1684.

Primary Examiner—Mahshid Saadat
Attorney, Agent, or Firm—Foley & Lardner

[57] ABSTRACT

A superconducting device comprises a substrate having a principal surface, a non-superconducting oxide layer having a similar crystal structure to that of an oxide superconductor formed on the principal surface, which can compensates the lattice mismatch between the substrate and the oxide superconductor, a superconducting source region and a superconducting drain region formed of c-axis oriented oxide superconductor thin films on the non-superconducting oxide layer, and an insulating region formed of a doped oxide superconductor on the non-superconducting oxide layer separating the superconducting source region and the superconducting drain region between them. On the insulating region an extremely thin superconducting channel formed of a c-axis oriented oxide superconductor thin film is arranged. The superconducting channel electrically connects the superconducting source region to the superconducting drain region, so that superconducting current can flow through the superconducting channel between the superconducting source region and the superconducting drain region. A gate electrode through a gate insulating layer is disposed on the superconducting channel for controlling the superconducting current flowing through the superconducting channel by the applied gate voltage. The superconducting source region, the superconducting drain region and the insulating region have the same thickness so that the extremely thin oxide superconductor thin film which constitutes the superconducting channel is formed flatwise.

13 Claims, 8 Drawing Sheets

SUPERCONDUCTING DEVICE HAVING A SUPERCONDUCTING CHANNEL FORMED OF OXIDE SUPERCONDUCTOR MATERIAL AND METHOD FOR MANUFACTURING THE SAME

BACKGROUND OF THE INVENTION

1. Field of the invention

The present invention relates to a superconducting device and a method for manufacturing the same, and more specifically to a superconducting device having an extremely thin superconducting channel formed of oxide superconductor material, and a method for manufacturing the same.

2. Description of related art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature.

Josephson device is one of well-known superconducting devices. However, since Josephson device is a two-terminal device, a logic gate which utilizes Josephson devices becomes complicated configuration. Therefore, three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulating layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to the superconducting proximity effect, and is controlled by an applied gate voltage. This type of the super-FET operates at a higher speed with a lower power consumption.

The second type of the super-FET includes a channel of a superconductor formed between a source electrode and a drain electrode, so that a current flowing through the superconducting channel is controlled by a voltage applied to a gate formed above the superconducting channel.

Both of the super-FETs mentioned above are voltage controlled devices which are capable of isolating output signals from input ones and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few ten nanometers, if the superconductor source electrode and the superconductor drain electrode are formed of the oxide superconductor material. However, it is very difficult to conduct a fine processing such as a fine pattern etching, so as to satisfy the very short separation distance mentioned above.

On the other hand, the super-FET having the superconducting channel has a large current capability, and the fine processing which is required to product the first type of the super-FET is not needed to product this type of super-FET.

In order to obtain a complete ON/OFF operation by a signal voltage of several volts applied to the gate electrode, both of the superconducting channel and the gate insulating layer should have an extremely thin thickness. For example, the superconducting channel formed of an oxide superconductor material should have a thickness of less than five nanometers and the gate insulating layer should have a thickness more than ten nanometers which is sufficient to prevent a tunnel current.

The super-FET has a superconducting source region and a superconducting drain region which have a sufficient thickness for forming contacts on them, for example more than 200 nanometers. Since, the relatively thick superconducting source region and the superconducting drain region are arranged at the both ends of the extremely thin superconducting channel, the super-FET may not have a planar upper surface. In this case, resolution of photolithography is spoiled so that the super-FET can not be manufactured so as to have a required fine structure. The amount of the integration of the super-FET is also limited by the resolution of photolithography.

In addition, in a prior art, in order to increase the superconducting current through interfaces between the superconducting channel and the superconducting source region and between the superconducting channel and the superconducting drain region, the superconducting source region and the superconducting drain region may be processed by etching so that they are smoothly connected to the superconducting channel.

However, the oxide superconductor thin films which constituted of the superconducting source region and the superconducting drain region are degraded during the etching so that the superconducting characteristics is affected. In addition, the etched surface of the oxide superconductor thin film is roughened. Therefore, if an oxide superconductor thin film which is constituted of the extremely thin superconducting channel is formed on the rough surface, its crystallinity and the superconducting properties are also affected. Additionally, an undesirable Josephson junction or resistance is generated at these interfaces.

By this, the super-FET manufactured by the above conventional process does not have an enough performance.

SUMMARY OF THE INVENTION

Accordingly, it is an object of the present invention to provide an FET type superconducting device having a superconducting channel constituted of an extremely thin oxide superconductor film, which have overcome the above mentioned defects of the conventional ones.

Another object of the present invention is to provide a method for manufacturing an FET type superconducting device which have overcome the above mentioned defects of the conventional ones.

The above and other objects of the present invention are achieved in accordance with the present invention by a superconducting device comprising a substrate having a principal surface, a non-superconducting oxide layer having a similar crystal structure to that of an oxide superconductor formed on the principal surface, which can compensates the lattice mismatch between the substrate and the oxide superconductor, a superconducting source region and a superconducting drain region formed of c-axis oriented oxide superconductor thin films on the non-superconducting oxide layer, an insulating region formed of a doped oxide superconductor on the non-superconducting oxide layer separating the superconducting source region and the superconducting drain region, an extremely thin superconducting channel on the insulating region, formed of a c-axis oriented oxide superconductor thin film which is prolonged to the superconducting source region and the superconducting drain region, which electrically connects the superconducting source region to the superconducting drain region, so that superconducting current can flow through the superconducting channel between the superconducting source region and the superconducting drain region, and a gate electrode through a gate insulating layer on the superconducting channel for controlling the superconducting current flowing through the superconducting channel by a signal voltage applied to the gate electrode, in which the superconducting source region, the superconducting drain region and the insulating region have the same thickness so that the extremely thin oxide superconductor thin film which constitutes the superconducting channel is formed flatwise.

In the superconducting device in accordance with the present invention, the superconducting channel, the part of the superconducting source region and the part of the superconducting drain region are formed of one c-axis oriented oxide superconductor thin film, therefore there is no undesirable resistance nor undesirable Josephson junction between the superconducting channel and the superconducting source region and between the superconducting channel and the superconducting drain region.

The insulating region, the superconducting source region and the superconducting drain region of the super-FET in accordance with the present invention have the same thickness. By this, the extremely thin oxide superconductor thin film which constitutes the superconducting channel can be formed flatwise. This improves not only the characteristics of the superconducting channel but also resolution of photolithography so that the gate insulating layer, the gate electrode, the source electrode and the drain electrode can be accurately formed on the extremely thin oxide superconductor thin film through photolithography process. In particular, the gate insulating layer and the gate electrode should be accurately formed in size and position for an excellent performance of the device. The above structures of the insulating region, the superconducting source region and the superconducting drain region insure the fine photolithography which is needed to form the gate insulating layer and the gate electrode accurately.

In one preferable embodiment of the present invention, the interfaces between the insulating region and the superconducting source region and between the insulating region and the superconducting drain region inclines so that the insulating region has a narrowing spacing at the top.

The inclined sides of the insulating region improve the conductance of superconducting current flowing from the superconducting source region into the extremely thin superconducting channel and flowing from the extremely thin superconducting channel to the superconducting drain region. By this, the current capability of the super-FET can be improved. For this purpose, the tilt angles of the sides of the insulating region to the principal surface of the oxide layer are preferably smaller than 40°. If the tilt angles are larger than 45°, the superconducting current can not flow so efficiently.

In the superconducting device in accordance with the present invention, the non-superconducting oxide layer preferably has a similar crystal structure to that of a c-axis oriented oxide superconductor thin film. In this case, the insulating region, the superconducting source region and the superconducting drain region, and also the superconducting channel of a c-axis oriented oxide or a c-axis oriented oxide superconductor thin film can be easily formed on the oxide layer.

Preferably, the above non-superconducting oxide layer is formed of a $Pr_1Ba_2Cu_3O_{7-y}$ oxide. A c-axis oriented $Pr_1Ba_2Cu_3O_{7-y}$ thin film has almost the same crystal lattice structure as that of a c-axis oriented oxide superconductor thin film. It compensates the lattice mismatch between the substrate and the oxide superconductor, therefore, the crystalline incompleteness of the c-axis oriented oxide superconductor is greatly improved at its bottom located on the $Pr_1Ba_2Cu_3O_{7-y}$ thin film. In addition, the effect of diffusion of the constituent elements of $Pr_1Ba_2Cu_3O_{7-y}$ into the oxide superconductor thin film is negligible and it also prevents the diffusion from substrate. Thus, the oxide superconductor thin film deposited on the $Pr_1Ba_2Cu_3O_{7-y}$ thin film has a high quality.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

In addition, the substrate can be formed of an insulating substrate, preferably an oxide single crystalline substrate such as MgO, $SrTiO_3$, YSZ, etc. These substrate materials are very effective in forming or growing a crystalline film having a well defined crystalline orientation.

However, in one preferred embodiment, the super-FET can be formed on a substrate of a conductive material, if the above oxide layer is deposited thereon. If the substrate is formed of a conductive material, a substrate potential can be applied to the super-FET of this structure. By this, the substrate to which a potential is applied can shield electromagnetic field around the super-FET, so that the superconducting channel of the super-FET is not affected by the other devices located near the super-FET. In addition, the electric lines of force generated by the applied gate voltage is terminated at the substrate, so that this type of super-FET is hardly affected by a back gate effect caused by the electric field around the super-FET. Therefore, the operation of the super-FET is stabilized and reliable.

Additionally, since the substrate potential is maintained, leakage of superconducting current is prevented when a voltage is applied to the gate electrode so as to shut the channel completely. The substrate also functions as a magnetic shield of a back plane so that the superconducting portions of the super-FET is not affected by magnetic field around the super-FET.

By applying a signal voltage to the substrate corresponding to the signal voltage applied to the gate electrode, it is also possible to form a double sided and/or dual gate structure. By this, modulation of superconducting current flowing through the superconducting channel becomes easier.

According to another aspect of the present invention, there is provided a method of manufacturing a superconducting device comprising the steps of depositing on a principal surface of a substrate a non-superconducting oxide layer having a similar crystal structure to that of a c-axis oriented oxide superconductor thin film, depositing a first c-axis oriented oxide superconductor thin film having a sufficient thickness for forming a contact on it on the non-superconducting oxide layer, implanting an impurity ion beam to a center portion of the first oxide superconductor thin film so that a insulating region is formed at the center portion of the first oxide superconductor thin film, which divides the first oxide superconductor thin film into a superconducting source region and a superconducting drain region, depositing an extremely thin second c-axis oriented oxide superconductor thin film on the first oxide superconductor thin film so as to form a superconducting channel on the insulating region, depositing an insulating layer on the second c-axis oriented oxide superconductor thin film so as to form a gate insulating layer on the superconducting channel, and forming a gate electrode on the gate insulating layer.

In the above method in accordance with the present invention, no etching process is necessary for processing an oxide superconductor thin film. Therefore, oxide superconductor thin films of the super-FET are not degraded, so that the oxide superconductor thin films have good superconducting characteristics.

In one preferred embodiment, the ion beam is implanted with the incident angle relative to the oxide superconductor thin film in an range larger than 45° so that the largest incident angle of the ion beam to the normal line of the oxide superconductor thin film is not smaller than 45° and the smallest incident angle is more less than −45°. It is not necessary that the ion beam is irradiated symmetrically to the normal line of the superconductor thin film.

According to still another aspect of the present invention, there is provided a method of manufacturing a superconducting device, comprising the steps of depositing on a principal surface of a substrate a non-superconducting oxide layer having a similar crystal structure to that of a c-axis oriented oxide superconductor thin film, depositing a c-axis oriented oxide superconductor thin film having a thickness of several parts of a superconducting source region and a superconducting drain region on the non-superconducting oxide layer, implanting an impurity ion beam to a center portion of the oxide superconductor thin film so that an insulating region is formed at the center portion of the oxide superconductor thin film, which divides the oxide superconductor thin film into two part, depositing another c-axis oriented oxide superconductor thin film of substantially the same thickness on the oxide superconductor thin film having the insulating region, implanting an impurity ion beam to a center portion of the upper oxide superconductor thin film so that a narrower insulating region is formed at the center portion of the oxide superconductor thin film than that of the previously deposited oxide superconductor thin film, which divides the oxide superconductor thin film into two part, repeating the processes of depositing an oxide superconductor thin film of substantially the same thickness and of forming a narrower insulating region than that of the lower oxide superconductor thin film by implanting the impurity ion beam so that a superconducting source region and a superconducting drain region having a sufficient thickness for forming a contacts on them separated by an insulating region having a narrow spacing at the top, depositing an extremely thin c-axis oriented oxide superconductor thin film on the superconducting source region, the superconducting drain region and the insulating region so as to form a superconducting channel on the insulating region, depositing an insulating layer on the extremely thin c-axis oriented oxide superconductor thin film so as to form a gate insulating layer on the superconducting channel, and forming a gate electrode on the gate insulating layer.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1H, the process in accordance with the present invention for manufacturing the super-FET will be described.

Figure 1A:
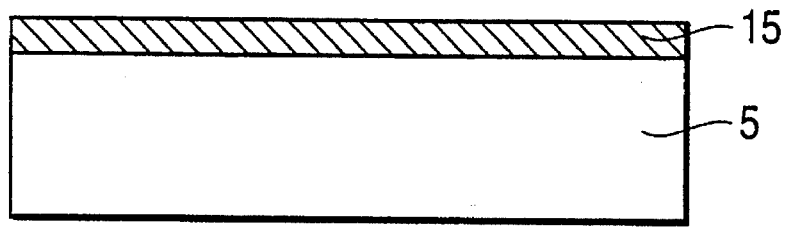
FIGS. 1A to 1H are diagrammatic sectional views for illustrating an embodiment of the process in accordance with the present invention for manufacturing the super-FET.

As shown in FIG. 1A, a $Pr_1Ba_2Cu_3O_{7-y}$ oxide layer 15 is deposited on a $SrTiO_3$ (100) single crystalline substrate 5 by an MBE (Molecular Beam Epitaxy). The $Pr_1Ba_2Cu_3O_{7-y}$ oxide layer 15 is formed under a substrate temperature of 800° C. so as to have a thickness of 20 nanometers. A condition of forming the $Pr_1Ba_2Cu_3O_{7-y}$ oxide layer 15 by an MBE is as follows:

Molecular beam source Pr: 1225° C.

and its crucible temperature Ba: 600° C.

Cu: 1040° C.

Pressure $1\times10^{-5}$ Torr

When an oxide superconductor thin film is deposited on the $Pr_1Ba_2Cu_3O_{7-y}$ oxide layer 15, the $Pr_1Ba_2Cu_3O_{7-y}$ oxide layer 15 compensates imperfection of Cu—O planes of oxide superconductor crystals of the bottom portion the oxide superconductor thin film so that current capability of the oxide superconductor thin film is improved. For this purpose, the $Pr_1Ba_2Cu_3O_{7-y}$ oxide layer 15 preferably has a thickness of 10 to 30 nanometers and should have high crystallinity. If the $Pr_1Ba_2Cu_3O_{7-y}$ oxide layer 15 is thinner than 10 nanometers, the $Pr_1Ba_2Cu_3O_{7-y}$ oxide layer is insufficient to absorb the lattice mismatch between the substrate and the oxide superconductor so that it can not compensate the imperfection of the Cu—O planes. Even if the $Pr_1Ba_2Cu_3O_{7-y}$ oxide layer 15 is thicker than 30 nanometers, the effect on the Cu—O planes is the same.

An MgO (100) substrate and a YSZ (yttrium stabilized zirconia) can be also used as the substrate 5 instead of the SrTiO$_3$ (100) substrate.

Figure 1B:
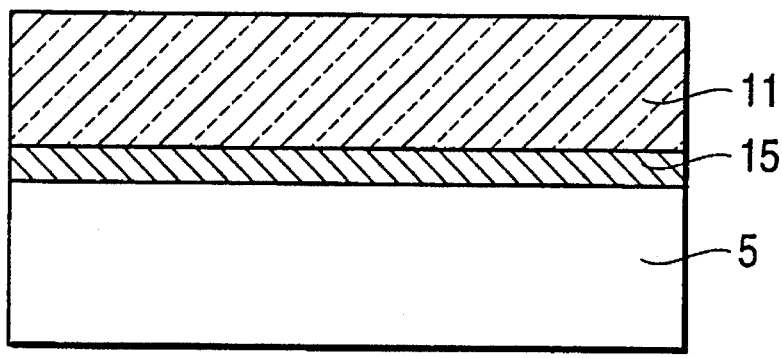

As shown in FIG. 1B, a c-axis oriented Y$_1$Ba$_2$Cu$_3$O$_{7-x}$ oxide superconductor thin film 11 is deposited on the Pr$_1$Ba$_2$Cu$_3$O$_{7-y}$ oxide layer 15 by an MBE. The Y$_1$Ba$_2$Cu$_3$O$_{7-x}$ oxide superconductor thin film 11 is formed successively to the Pr$_1$Ba$_2$Cu$_3$O$_{7-y}$ oxide layer 15 by switching the Pr molecular beam source to a Y molecular beam source under a substrate temperature of 700° C. so as to have a thickness of 200 nanometers which is sufficient to forth a contact on it. A condition of forming the Y$_1$Ba$_2$Cu$_3$O$_{7-x}$ oxide superconductor thin film 11 by an MBE is as follows:

Molecular beam source Y: 1250° C.

and its crucible temperature Ba: 600° C.

Cu: 1040° C.

Pressure 1 ×10$^{-5}$ Torr

Figure 1C:
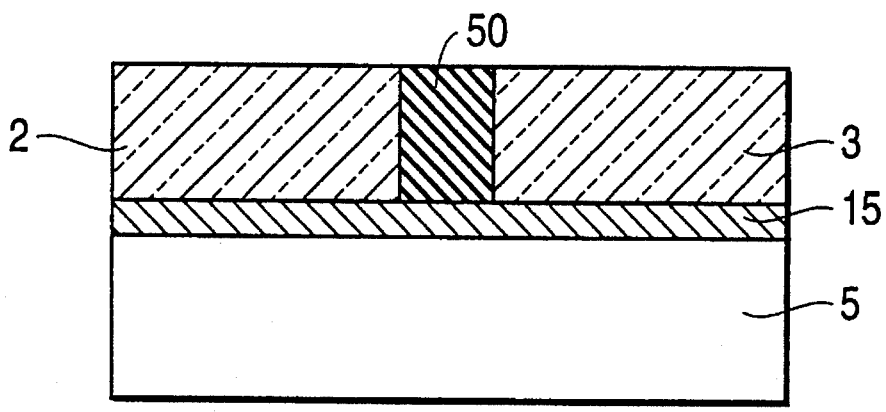

Thereafter, as shown in FIG. 1C, a Ga ion beam is implanted to a center portion of the Y$_1$Ba$_2$Cu$_3$O$_{7-x}$ oxide superconductor thin film 11 by a focussed ion beam apparatus with an energy of 50 keV so as to form an insulating region 50 having a width of 0.07 μm. The insulating region 50 is not necessary to be converted to a "complete" insulator, but is a material which is not in the superconducting state when the Y$_1$Ba$_2$Cu$_3$O$_{7-x}$ oxide superconductor is in the superconducting state. The amount of the dosed ions preferably from 1×10$^{16}$ to 1×10$^{18}$ cm$^{-2}$, and the ions are preferably selected from a group consisting of Ga, Au and Si. The insulating region 50 is formed by scanning the ion beam relative to the substrate 5 on which the Y$_1$Ba$_2$Cu$_3$O$_{7-x}$ oxide superconductor thin film 11 is formed so as to completely divide the Y$_1$Ba$_2$Cu$_3$O$_{7-x}$ oxide superconductor thin film 11 into a superconducting source region 2 and a superconducting drain region 3. In this connection, it is preferable that the ion beam implantation is successively carded out after the deposition of the Y$_1$Ba$_2$Cu$_3$O$_{7-x}$ oxide superconductor thin film 11 by using an MBE apparatus which possesses a focused ion beam gun. The insulating region 50 preferably has a width of 0.01 to 0.25 μm. If the insulating region 50 is thinner than 0.01 μm, tunnel current may flow between the superconducting source region 2 and the superconducting drain region 3 beyond the insulating region 50. If the insulating region is wider than 0.25 μm, the channel length becomes so long compared to its thickness that it is not favorable for production and also causes difficulty for high density integration. The energy of the ion beam is preferably 30 to 100 keV. If the energy of the ion beam is lower than 30 keV, the insulating region does not completely separate the Y$_1$Ba$_2$Cu$_3$O$_{7-x}$ oxide superconductor thin film 11. If the energy of the ion beam is higher than 100 keV, the surface of the Y$_1$Ba$_2$Cu$_3$O$_{7-x}$ oxide superconductor thin film 11 is destroyed and etched away.

Figure 1D:
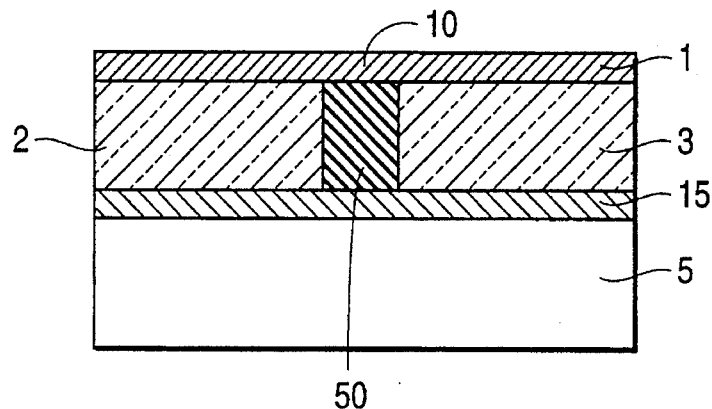

Then as shown in FIG. 1D, an extremely thin c-axis oriented Y$_1$Ba$_2$Cu$_3$O$_{7-x}$ superconductor thin film 1 having a thickness of 5 nanometers is formed on the insulating region 50, the superconducting source region 2 and the superconducting drain region 3. The Y$_1$Ba$_2$Cu$_3$O$_{7-x}$ superconductor thin film I is deposited by an MBE under the same condition as that of the Y$_1$Ba$_2$Cu$_3$O$_{7-x}$ superconductor thin film 11. A portion of the Y$_1$Ba$_2$Cu$_3$O$_{7-x}$ superconductor thin film 1 on the insulating region 50 becomes a superconducting channel 10.

Figure 1E:
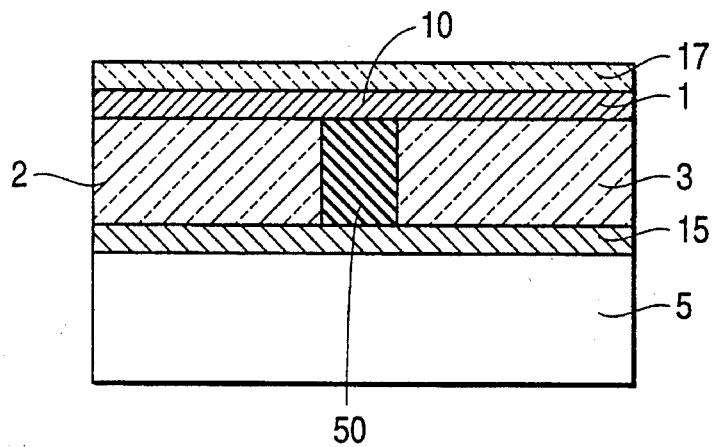

Thereafter, a SrTiO$_3$ film 17 which will be a gate insulating layer is deposited on the Y$_1$Ba$_2$Cu$_3$O$_{7-x}$ superconductor thin film 1 also by an MBE as shown in FIG. 1E. The SrTiO$_3$ film 17 has a thickness of 10 nanometers which is sufficient to prevent tunnel current.

Figure 1F:
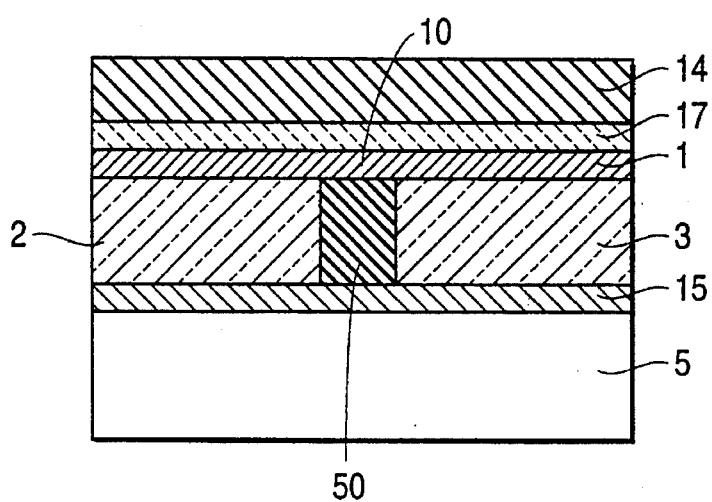

Then, a Pt layer 14 which will be a gate electrode on the SrTiO$_3$ film 17 is deposited by an electron beam assisted evaporation, as shown in FIG. 1F.

Figure 1G:
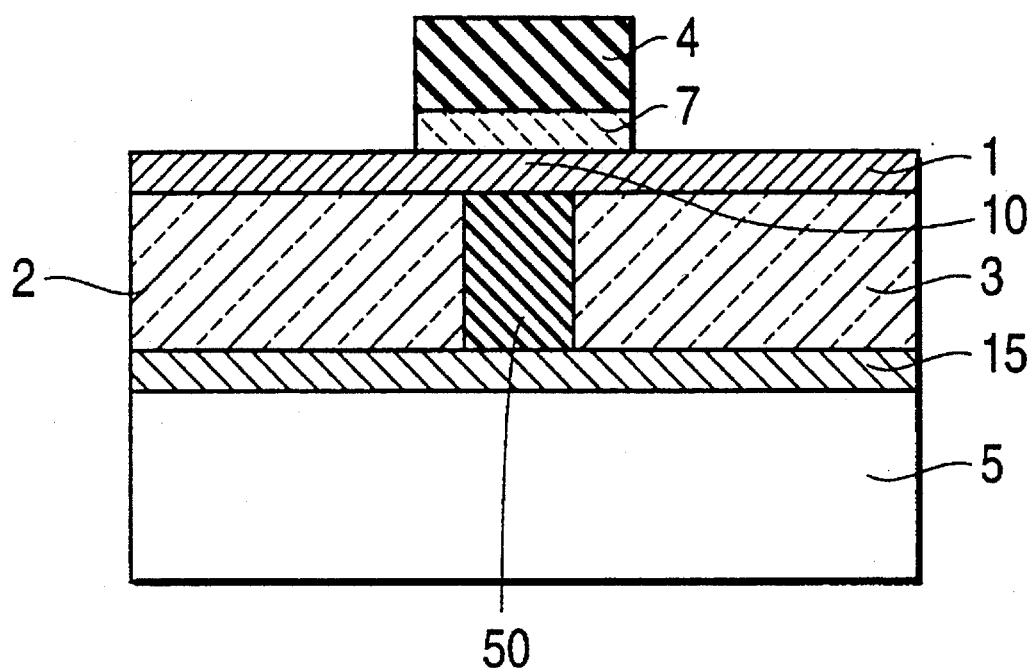

Thereafter, as shown in FIG. 1G, the part of the Pt layer 14 is etched by an ion milling using Ar ions and the part of the SrTiO$_3$ film 17 is also etched by a wet etching using HF so that the Pt layer 14 and the SrTiO$_3$ film 17 are completely removed excluding a portion on the insulating region 50 so as to form a gate electrode 4 and a gate insulating layer 7. The width of the gate electrode 4 and the gate insulating layer 7 are preferably longer than the width of the insulating region 50 in order to obtain good operating properties.

Figure 1H:
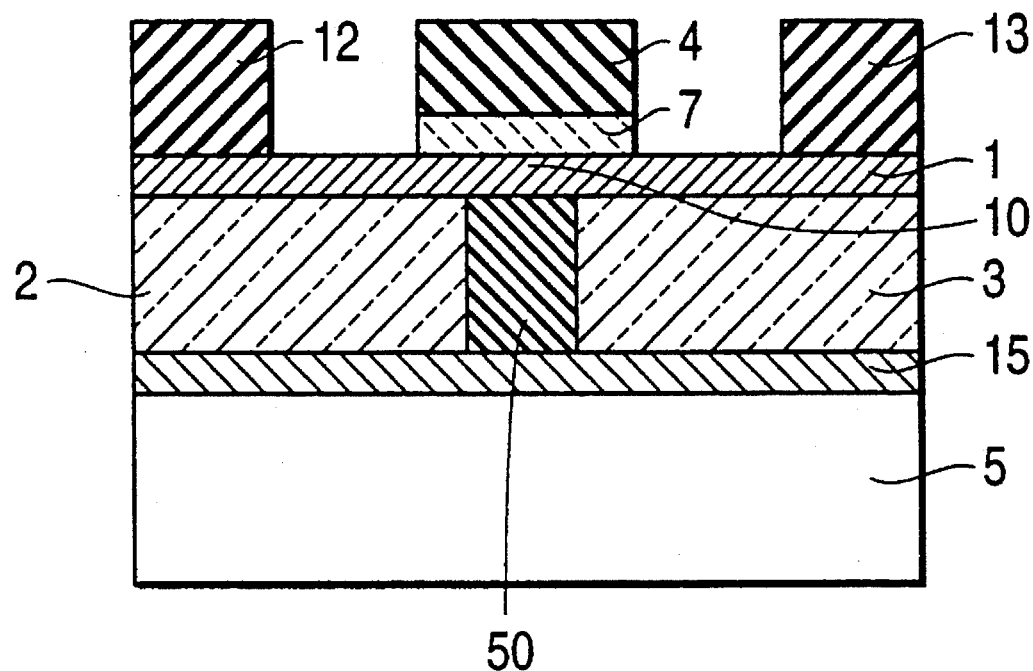

Finally, as shown in FIG. 1H, metal source and drain electrodes 12 and 13 of Au are formed on the superconducting source region 2 and the superconducting drain region 3. With this, the super-FET in accordance with the present invention is completed.

In the above mentioned method in accordance with the present invention, no etching process is necessary to define the channel area from an oxide superconductor thin film. Therefore, oxide superconductor thin films of the super-FET manufactured by the above method are not degraded, so that the oxide superconductor thin films have good superconducting characteristics. In addition, since the superconducting channel 10, the part of the superconducting source region 2 and the part of the superconducting drain region 3 are formed of the same c-axis oriented oxide superconductor thin films, the above mentioned super-FET manufactured in accordance with the embodiment of the method of the present invention has no undesirable resistance nor undesirable Josephson junction between the superconducting channel 10 and the superconducting source region 2 and between the superconducting channel 10 and the superconducting drain region 3.

Upper surfaces of the insulating region 50, the superconducting source region 2 and the superconducting drain region 3 are made at the same level. By this, the extremely thin oxide superconductor thin film 1 which constitutes the superconducting channel 10 can be formed flatwise. This improves resolution of photolithography so that the gate insulating layer 7, the gate electrode 4, the source electrode 12 and the drain electrode 13 can be accurately formed using photolithography. In particular, the gate insulating layer 7 and the gate electrode 4 should be accurately formed in size and position to obtain the excellent performance. The above structures of the insulating region 50, the superconducting source region 2 and the superconducting drain region 3 make the fine processing possible which is needed to accurately form the gate insulating layer 7 and the gate electrode 4.

Figure 2A:
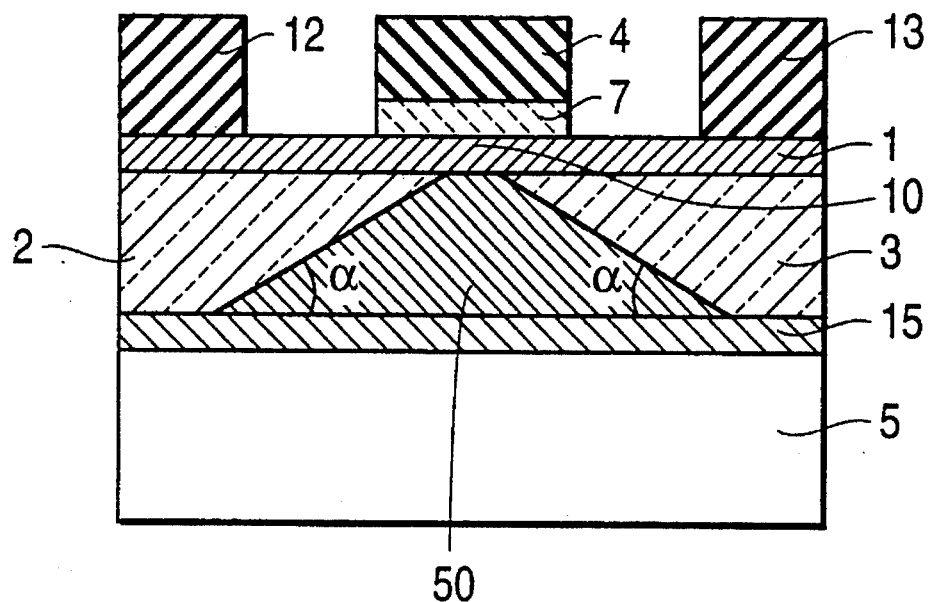
FIGS. 2A and 2B are diagrammatic sectional views for illustrating one variation of the super-FET and a method used in its manufacture in accordance with the present invention.

FIG. 2A shows a sectional view of a variation of the above mentioned super-FET. The super-FET shown in FIG. 2A has an insulating region 50 of which the width of the top portion is narrower than that of the bottom portion and of which the tilt angles α of the sides are 30°. The inclined sides of the insulating region 50 improve the conductance of superconducting current flowing from the superconducting source region 2 into the extremely thin superconducting channel 10 and flowing from the extremely thin superconducting channel 10 to the superconducting drain region 3. For this purpose, the tilt angles α of the sides of the insulating region 50 are preferably smaller than 40°. If the tilt angles α are larger than 45°, the superconducting current does not flow so efficiently. It is not necessary that the tilt angles α are the same. Each of the tilt anglesα preferably has a different value which is required by the characteristics of the superconducting current flow, or of the superconducting source region and the superconducting drain region.

Figure 2B:
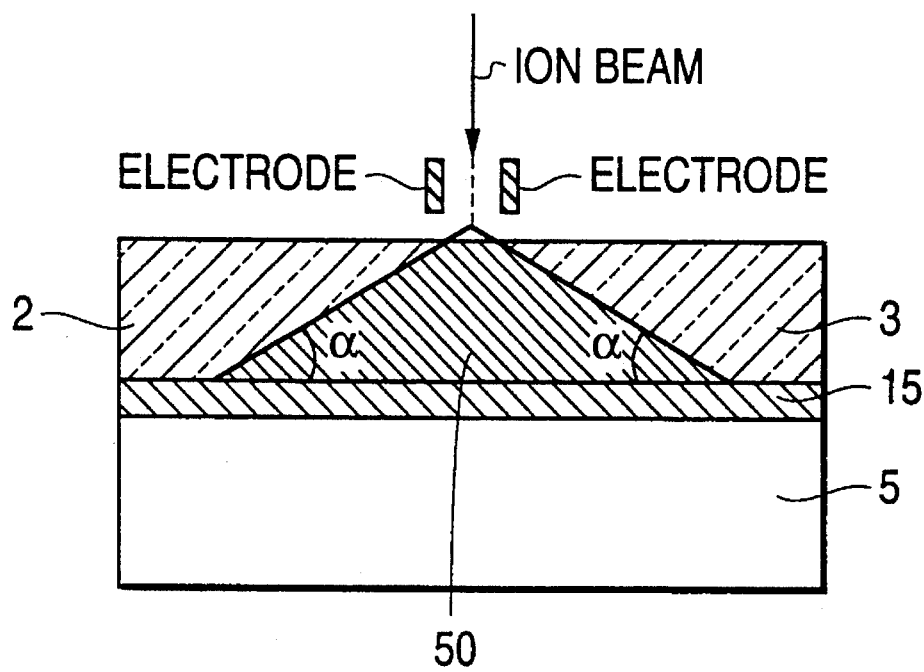

In order to form the insulating region 50 having sides of which the tilt angles α are smaller than 40°, the ion beam is implanted with smaller incident angle or the substrate is tilted in an angle range larger than 45° so that the largest angle of incidence of the ion beam to the normal line of the $Y_1Ba_2Cu_3O_{7-x}$ superconductor thin film 11 is not smaller than 45° and the smallest angle of incidence is more less than −45° in the process shown in FIG. 2B.

The other points of the super-FET are the same as those of the super-FET shown in FIG. 1H.

Embodiment 2

Referring to FIGS. 3A to 3H, a second embodiment of the process for manufacturing the superconducting device will be described.

Figure 3A:
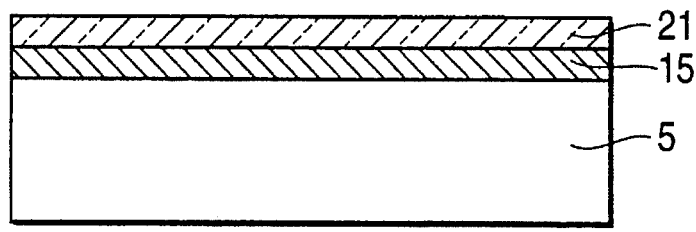
FIGS. 3A to 3H are diagrammatic sectional views for illustrating featured steps of a second embodiment of the process in accordance with the present invention for manufacturing the super-FET.

In this second embodiment, the same processings as those shown in FIGS. 1A is performed. After the $Pr_1Ba_2Cu_3O_{7-y}$ oxide layer 15 is formed on the substrate 5, a c-axis oriented $Y_1Ba_2Cu_3O_{7-x}$ oxide superconductor thin film 21 is deposited on the $Pr_1Ba_2Cu_3O_{7-y}$ oxide layer 15 by an MBE, as shown in FIG. 3A. The $Y_1Ba_2Cu_3O_{7-x}$ oxide superconductor thin film 21 is formed successively to the $Pr_1Ba_2Cu_3O_{7-y}$ oxide layer 15 by switching the Pr molecular beam source to a Y molecular beam source under a substrate temperature of 700° C. so as to have a thickness of 50 nanometers. A condition of forming the $Y_1Ba_2Cu_3O_{7-x}$ oxide superconductor thin film 21 by an MBE is as follows:

Molecular beam source Y: 1250° C.

and its crucible temperature Ba: 600° C.

Cu: 1040° C.

Pressure $1\times10^{-5}$ Torr

Figure 3B:
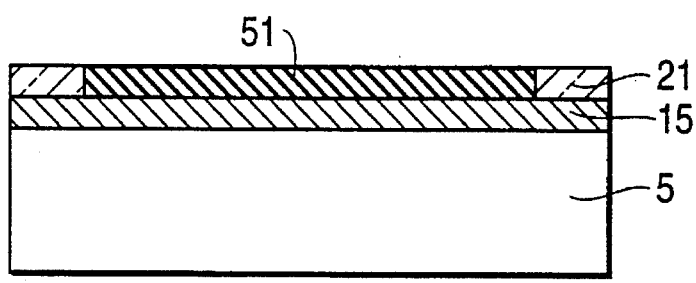

Thereafter, as shown in FIG. 3B, a Ga ion beam is implanted to a center portion of the $Y_1Ba_2Cu_3O_{7-x}$ oxide superconductor thin film 21 by a focused ion beam apparatus with an energy of 50 keV so as to form an insulating region 51 having a width of 0.75 μm. The insulating region 51 is formed by scanning the ion beam relative o the substrate 5 on which the $Y_1Ba_2Cu_3O_{7-x}$ oxide superconductor thin film 21 is formed so as to completely divide the $Y_1Ba_2Cu_3O_{7-x}$ oxide superconductor thin film 21 into two parts. In this connection, it is preferable that the ion beam implantation is successively carried out after the deposition of the $Y_1Ba_2Cu_3O_{7-x}$ oxide superconductor thin film 21 by using an MBE apparatus which possesses a focused ion beam gun. The insulating region 51 preferably has a width of from 0.6 to 1.0 μm. If the insulating region 51 is narrower than 50 nanometers, tunnel current may flow between the two parts beyond the insulating region 51. As explained hereinafter, the insulating region is formed so as to have a narrow spacing at the top. Therefore, in order to insure a sufficient spacing at the top, the insulating region 51 preferably has a width at least 0.6 μm. If the insulating region is wider than 1.0 μm, the size of the device becomes so large that it is not favorable for high density integration. The energy of the ion beam is preferably 30 to 100 keV. If the energy of the ion beam is lower than 30 keV, the insulating region does not completely divide the $Y_1Ba_2Cu_3O_{7-x}$ oxide superconductor thin film 21. If the energy of the ion beam is higher than 100 keV, the surface of the $Y_1Ba_2Cu_3O_{7-x}$ oxide superconductor thin film 21 is destroyed and etched away.

Figure 3C:
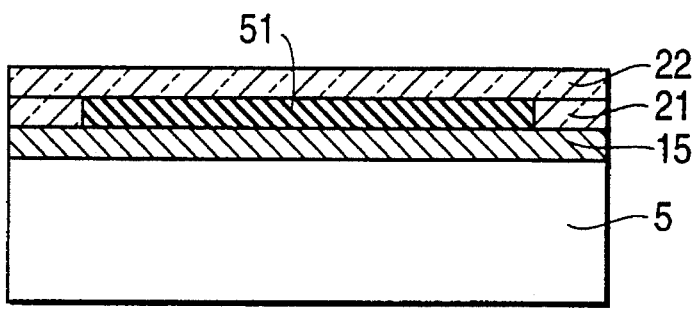

Then, another c-axis oriented $Y_1Ba_2Cu_3O_{7-x}$ oxide superconductor thin film 22 is deposited on the $Y_1Ba_2Cu_3O_{7-x}$ oxide superconductor thin film 21, as shown in FIG. 3C. The $Y_1Ba_2Cu_3O_{7-x}$ oxide superconductor thin film 22 is formed by a MBE under the same condition as that of the $Y_1Ba_2Cu_3O_{7-x}$ oxide superconductor thin film 21 so as to have the same thickness as that of the $Y_1Ba_2Cu_3O_{7-x}$ oxide superconductor thin film 21.

Figure 3D:
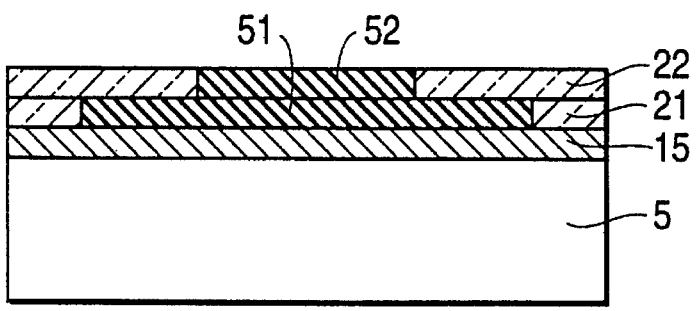

Thereafter, a Ga ion beam is implanted to a center portion of the $Y_1Ba_2Cu_3O_{7-x}$ oxide superconductor thin film 22 by a focused ion beam apparatus with an energy of 50 keV so as to form an insulating region 52 having a width of 0.50 μm, as shown in FIG. 3D. The insulating region 52 is formed to be little narrower than the insulating region 51.

Figure 3E:
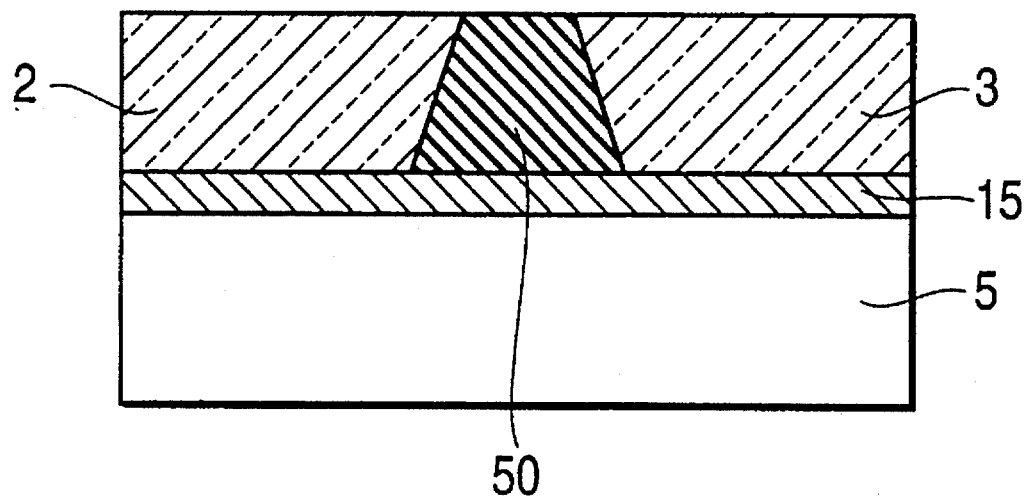

Repeating the above process, an oxide superconductor layer which is divided into a superconducting source region 2 and a superconducting drain region 3 by an insulating region 50 having a narrow spacing at the top, as shown in FIG. 3E. In this embodiment, the above process is repeated four times. Namely, the $Y_1Ba_2Cu_3O_{7-x}$ oxide superconductor thin film having a thickness of 50 nanometers is deposited and the insulating region is formed at the center portion of the $Y_1Ba_2Cu_3O_{7-x}$ oxide superconductor thin film by an ion beam implantation four times, so that a superconducting source region 2 and a superconducting drain region 3 having a thickness of 200 nanometers are formed.

In the above mentioned process, each of the c-axis oriented $Y_1Ba_2Cu_3O_{7-x}$ oxide superconductor thin films preferably has a thickness of 30 to 70 nanometers. If the oxide superconductor thin films are thinner than 30 nanometers, many repetition of the process is necessary for forming the superconducting source region 2 and the superconducting drain region 3 having an enough thickness. This results low productivity. If the oxide superconductor thin films are thicker than 70 nanometers, the sides of the insulating region does not have smooth interfaces. In addition, the required energy of ion beam for forming the insulating region becomes larger so that each of the surfaces of the oxide superconductor thin films may have a danger to be destroyed.

Figure 3F:
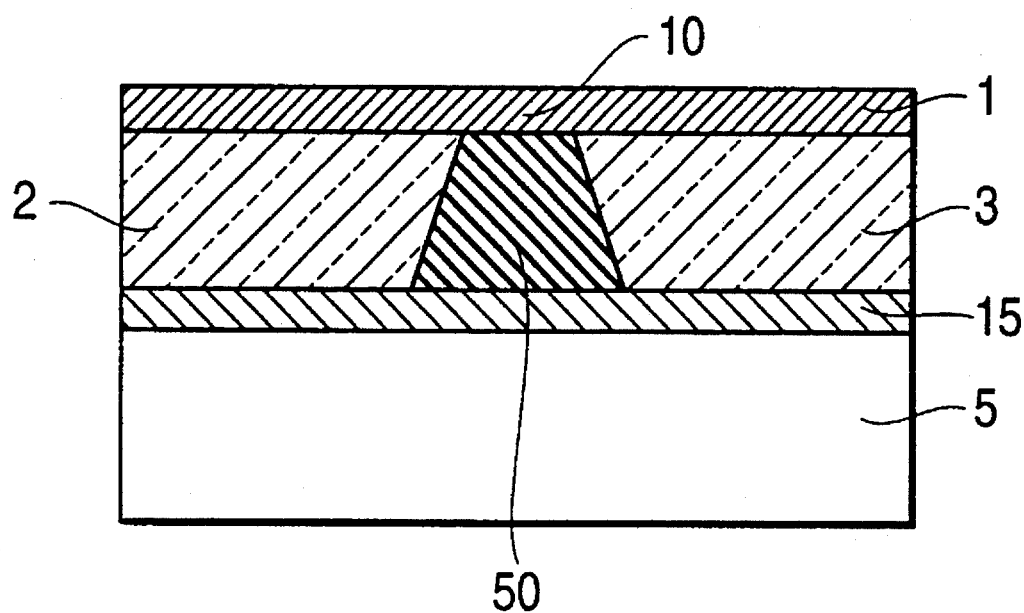

Thereafter as shown in FIG. 3F, an extremely thin c-axis oriented $Y_1Ba_2Cu_3O_{7-x}$ superconductor thin film 1 having a thickness of 5 nanometers is formed on the insulating region 50, the superconducting source region 2 and the superconducting drain region 3. The $Y_1Ba_2Cu_3O_{7-x}$ superconductor thin film 1 is deposited by an MBE under the same condition as that of the $Y_1Ba_2Cu_3O_{7-x}$ superconductor thin film 21. A portion of the $Y_1Ba_2Cu_3O_{7-x}$ superconductor thin film 1 on the insulating region 50 becomes a superconducting channel 10.

Figure 3G:
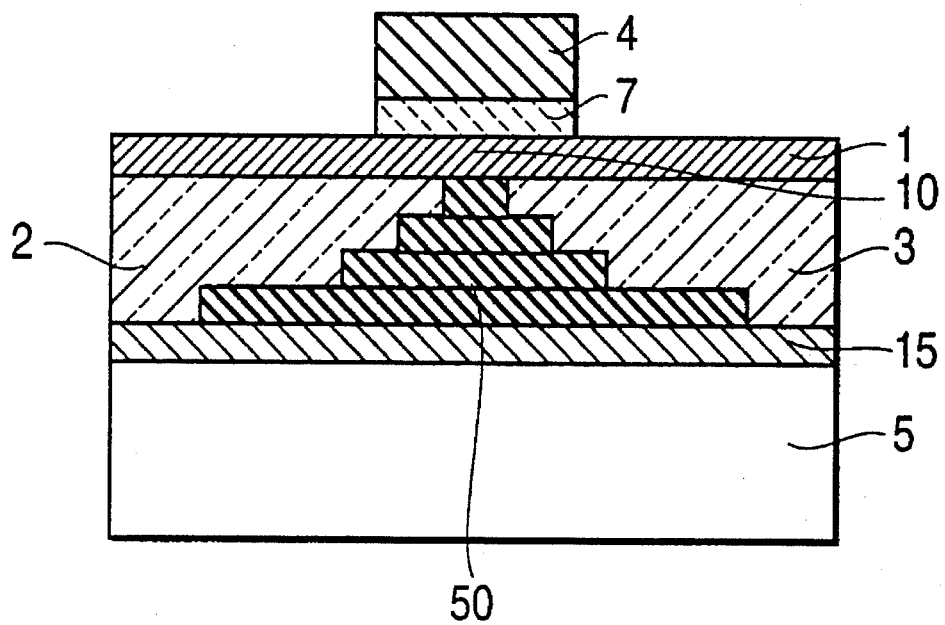

Then, as shown in FIG. 3G, a gate electrode 4 of Au and a gate insulating layer 7 of $SrTiO_3$ are formed by the same process as Embodiment 1. The width of the gate electrode 4 and the gate insulating layer 7 are preferably longer than that of the insulating region 50 at the top to obtain good properties.

Figure 3H:
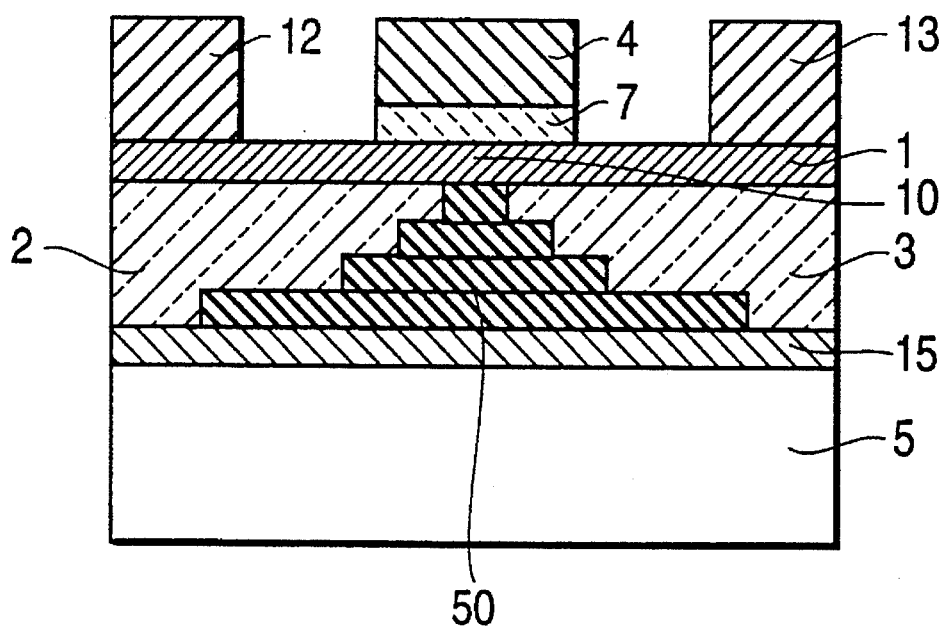

Finally, as shown in FIG. 3H, metal source and drain electrodes 12 and 13 of Au are formed on the superconducting source region 2 and the superconducting drain region 3. With this, the super-FET in accordance with the present invention is completed.

In the above mentioned method in accordance with the present invention, no etching process is necessary to define the channel area from an oxide superconductor thin film. Therefore, oxide superconductor thin films of the super-FET manufactured by the above method are not degraded, so that the oxide superconductor thin films have good superconducting characteristics.

In particular, in the above process, the insulating region which divides the oxide superconductor thin film into the superconducting source region and the superconducting drain region is formed by repeating processes of forming a thin oxide superconductor thin film and of implanting an ion beam to its center portion so as to form an insulating region. Since the oxide superconductor thin films are thinner, the energy of the ion beam can be lowered so that the surfaces of the oxide superconductor thin films are free from degradation. The repeating processes can be carried out in one chamber so that the interfaces between the oxide superconductor thin films substantially disappear and the oxide superconductor thin films are substantially continuous.

In addition, the insulating region 50 has a narrow spacing at the top. The inclined sides of the insulating region 50 improve the conductance of the superconducting current flowing from the superconducting source region 2 into the extremely thin superconducting channel 10 and flowing from the extremely thin superconducting channel 10 to the superconducting drain region 3.

Since the superconducting channel 10, the part of the superconducting source region 2 and the part of the superconducting drain region 3 are formed of c-axis oriented oxide superconductor thin films, the above mentioned super-FET manufactured in accordance with the embodiment of the method of the present invention has no undesirable resistance nor undesirable Josephson junction between the superconducting channel 10 and the superconducting source region 2 and between the superconducting channel 10 and the superconducting drain region 3.

Embodiment 3

One variation of the above super-FET will be explained hereinafter. This variation has the same shape shown in FIG. 2. The feature of this variation is that the substrate 5 is formed of a conductive materials. In is embodiment, the substrate 5 is formed of Nb 0.05 wt% doped $SrTiO_3$ having a resistivity of $5 \times 10^{-2}$ $\Omega$cm. The $Pr_1Ba_2Cu_3O_{7-y}$ oxide layer 15 not only compensates the lattice mismatch between the substrate and the oxide superconductor, but also functions as an insulating layer. Since the other structure is the same as the super-FET shown in FIG. 2, explanations are omitted.

Since the substrate is formed of a conductive material, a substrate potential can be applied to the super-FET of this structure. By this, the substrate applied a potential can shield the super-FET from the electro-magnetic field around it, so that the superconducting characteristics of the super-FET is not affected by devices located near the super-FET. Therefore, the electric lines of force generated by the applied gate voltage is terminated at the substrate, so that the super-FET is hardly affected by a back gate effect caused by the electric field around the super-FET. In this connection, the operation of the super-FET is stabilized and reliable.

Additionally, since the substrate potential has a fixed value, leakage current is prevented when a voltage is applied to the gate electrode so as to isolate the gate completely. The substrate also functions as a magnetic shield of a back plane so that the superconducting portions of the super-FET is not affected by magnetic field around the super-FET.

By applying a voltage signal to the substrate corresponding to the voltage signal applied to the gate electrode, it is also possible to form a double sided and/or dual gate structure. By this, modulation of superconducting current flowing through the superconducting channel becomes easier.

In the above super-FET, the conductive substrate has a resistivity of $10^{-3}$ to $10^6$ $\Omega$cm. If the resistivity of the substrate is made smaller than $10^{-3}$ $\Omega$cm, the substrate loses its crystallinity because of excessive dopants. On the other hand, if resistivity is larger than $10^6$$\Omega$cm, the substrate itself constitutes a capacitance which causes the additional parasitic effect.

The conductive substrate is preferably formed of 0.01 to 0.5 wt % Nb doped $SrTiO_3$ or Fe doped $SrTiO_3$, etc. These materials have similar lattice parameters to those of oxide superconductors. So these substrates are suitable to grow epitaxial oxide superconductor thin films. In addition, there is no problem of mutual diffusion between the oxide superconductor thin films and the substrates.

Figure 4:
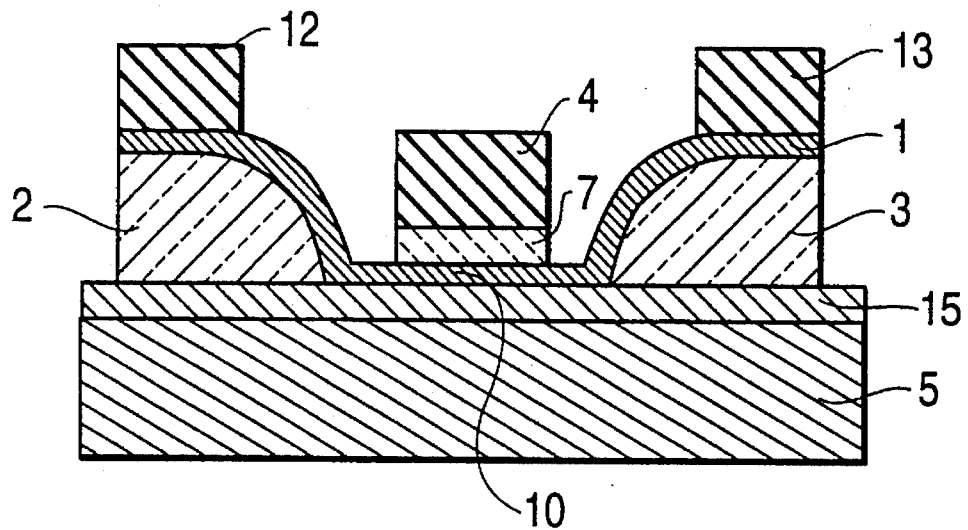
FIG. 4 is a diagrammatic sectional view of still another embodiment of the super-FET in accordance with the present invention.

FIG. 4 shows a sectional view of one variation of the super-FET having a conductive substrate. The super-FET shown in FIG. 4 includes a substrate 5 formed of 0.05 wt % Nb doped $SrTiO_3$ having a resistivity of $5 \times 10^{-2}$ $\Omega$cm, and an oxide layer 15 formed of $Pr_1Ba_2Cu_3O_{7-y}$ having a thickness of on the order of 20 nanometers on the substrate 5. The super-FET further includes a superconducting channel 10 on a center portion of the oxide layer 15, a superconducting source region 2 formed of $Y_1Ba_2Cu_3O_{7-x}$ superconductor having a thickness of 200 nanometers on a left portion of the oxide layer 15, and a superconducting drain region 3 formed of $Y_1Ba_2Cu_3O_{7-x}$ superconductor having a thickness of 200 nanometers on a right portion of the oxide layer 15. The superconducting channel 10 is formed of a $Y_1Ba_2Cu_3O_{7-x}^\delta$ superconductor thin film 1 having a thickness of 5 nanometers prolonged on the superconducting source region 2 and the superconducting drain region 3. A gate insulating layer 7 of $SrTiO_3$ is formed on the superconducting channel 10, and a gate electrode 4 of Pt is disposed on the gate insulating layer 7. A source electrode 12 and a drain electrode of Au are respectively arranged on the superconducting source region 2 and the superconducting drain region 3.

The side surfaces of superconducting source region 2 and the superconducting drain region 3 are inclined so that superconducting current efficiently flows from the superconducting source region 2 into the extremely thin superconducting channel 10 and efficiently flows from the extremely thin superconducting channel 10 to the superconducting drain region 3.

Figure 5:
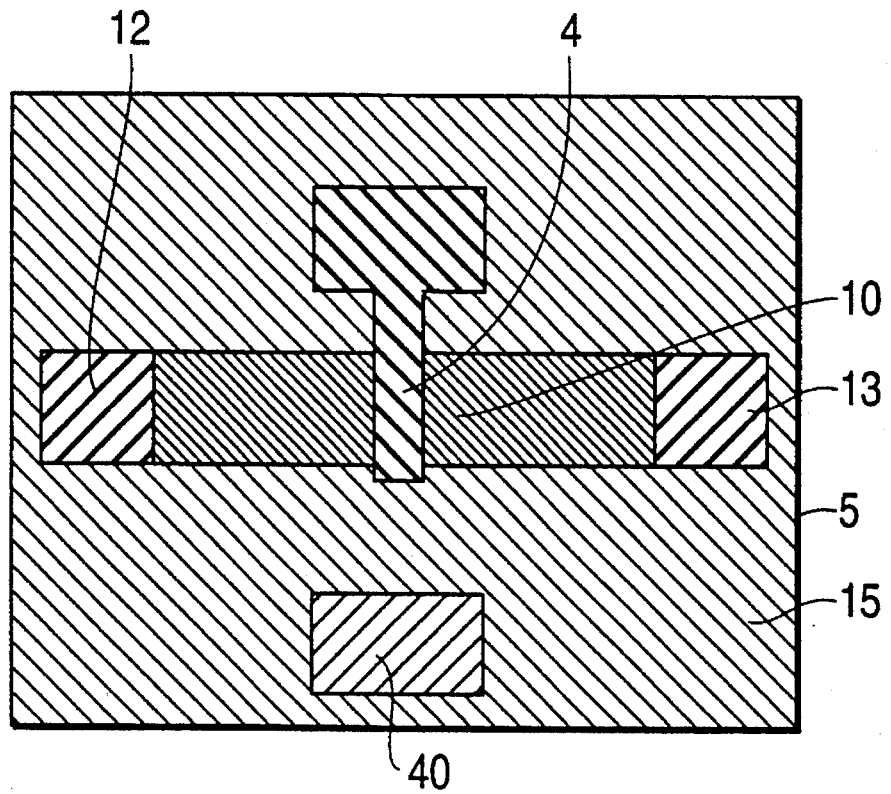
FIG. 5 is a plane view for illustrating the configuration for evaluating the back gate effect on the superconducting channel of the super-FET.

Effects of electric fields on the superconducting channels were evaluated for the super-FETs having structures shown in FIGS. 2 and 4. Two super-FETs one of which had a $SrTiO_3$ substrate and the other had a Nb doped $SrTiO_3$ substrate were prepared for each structure. A metal pad 40 was formed on the oxide layer 15 besides the superconducting channel 10 of each of the four super-FETs, as shown in FIG. 5.

When a voltage was applied to the metal pad 40, superconducting current flowing through the superconducting channel 10 of each of super-FETs having $SrTiO_3$ substrates widely fluctuated, so that the back gate effect was ascertained. On the contrary, superconducting current flowing through the superconducting channel 10 of each of super-FETs having Nb doped $SrTiO_3$ substrates varied within 1%, even if a voltage of $\pm 40$ V was applied to the metal pad 40. By this, it could be ascertained that the super-FET having a conductive substrate in accordance with the present invention had stable characteristics.

In the above mentioned embodiment, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting device comprising a substrate having a principal surface, a non-superconducting oxide layer having a similar crystal structure to that of an oxide superconductor formed on the principal surface, which can compensate the lattice mismatch between the substrate and the oxide superconductor, a superconducting source region and a superconducting drain region formed of c-axis oriented oxide superconductor thin films on the non-superconducting oxide layer, an insulating region formed of a doped oxide superconductor on the non-superconducting oxide layer separating the superconducting source region and the superconducting drain region, an extremely thin superconducting channel on the insulating region, formed of a c-axis oriented oxide superconductor thin film which is prolonged to the superconducting source region and the superconducting drain regions which electrically connects the superconducting source region to the superconducting drain region, so that superconducting current can flow through the superconducting channel between the superconducting source region and the superconducting drain region, and a gate electrode through a gate insulating layer on the superconducting channel for controlling the superconducting current flowing through the superconducting channel by a signal voltage applied to the gate electrode, wherein the insulation region has predetermined inclined straight side surfaces having predetermined tilt angles smaller than 40° such that the insulating region is narrower at the top than at the bottom and the superconducting source region, the superconducting drain region and the insulating region have the same thickness so that the extremely thin oxide superconductor thin film which constitutes the superconducting channel is formed flatwise.

2. A superconducting device claimed in claim 1 wherein the insulating region is formed of a Ga doped oxide superconductor, an Au doped oxide superconductor or a Si doped oxide superconductor.

3. A superconducting device claimed in claim 1 wherein the non-superconducting oxide layer has a similar crystal structure to that of a c-axis oriented oxide superconductor thin film.

4. A superconducting device claimed in claim 1 wherein the non-superconducting oxide layer is formed of a $Pr_1Ba_2Cu_3O_{7-y}$ thin film.

5. A superconducting device claimed in claim 1 wherein the oxide superconductor of the channel is formed of high-$T_c$ (high critical temperature) oxide superconductor.

6. A superconducting device as claimed in claim 5, wherein the oxide superconductor of the channel is formed of a high-$T_c$ copper oxide type superconductor.

7. A superconducting device claimed in claim 5 wherein the oxide superconductor is formed of oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

8. A superconducting device claimed in claim 1 wherein the substrate is formed of a material selected from the group consisting of a MgO (100) substrate, a $SrTiO_3$ (100) substrate and a YSZ substrate.

9. A superconducting device claimed in claim 1 wherein the substrate is formed of a conductive material.

10. A superconducting device claimed in claim 9 wherein the resistivity of the substrate is $10^{-3}$ to $10^6$ Ωcm.

11. A superconducting device claimed in claim 9 wherein the substrate is formed of Nb doped $SrTiO_3$ or Fe doped $SrTiO_3$.

12. A superconducting device claimed in claim 11 wherein the substrate is formed of Nb doped $SrTiO_3$ and wherein 0.01 to 0.5 wt % Nb is doped to $SrTiO_3$.

13. A superconducting device claimed in claim 11 wherein the substrate is formed of Fe doped $SrTiO_3$ and wherein 0.01 to 0.5 wt % Fe is doped to $SrTiO_3$.

* * * * *